United States Patent
Patil et al.

(10) Patent No.: US 9,520,324 B1
(45) Date of Patent: Dec. 13, 2016

(54) INTEGRATED CIRCUIT SYSTEM WITH EXTERNAL RESISTOR TO PROVIDE CONSTANT CURRENT BIAS AND METHOD OF MANUFACTURE THEREOF

(71) Applicant: Altera Corporation, San Jose, CA (US)

(72) Inventors: Dinesh Patil, Sunnyvale, CA (US); Minqing Cai, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 14/588,098

(22) Filed: Dec. 31, 2014

(51) Int. Cl.
*H01L 29/00* (2006.01)
*H01L 21/768* (2006.01)
*H01L 27/06* (2006.01)
*H01L 23/50* (2006.01)

(52) U.S. Cl.
CPC ......... *H01L 21/76838* (2013.01); *H01L 23/50* (2013.01); *H01L 27/0611* (2013.01)

(58) Field of Classification Search
CPC . H01L 21/76838; H01L 23/50; H01L 27/0611
See application file for complete search history.

(56) References Cited

U.S. PATENT DOCUMENTS

| | | | |
|---|---|---|---|
| 6,057,727 A | 5/2000 | Dautriche et al. | |
| 7,149,246 B1* | 12/2006 | Adams | H03F 1/0261 257/7 |
| 7,558,552 B1* | 7/2009 | Lee | H04L 25/0282 327/141 |
| 7,576,587 B2 | 8/2009 | Chan | |
| 2006/0006902 A1* | 1/2006 | Sagiv | H04L 25/0278 326/30 |
| 2007/0075691 A1* | 4/2007 | Burstein | H02M 3/1584 323/272 |
| 2010/0201405 A1* | 8/2010 | Ahmad | H02M 3/1584 327/108 |
| 2012/0250881 A1 | 10/2012 | Mulligan | |
| 2013/0036247 A1* | 2/2013 | Jadus | G06F 13/4295 710/305 |

* cited by examiner

*Primary Examiner* — Shaun Campbell
(74) *Attorney, Agent, or Firm* — Michael H. Lyons

(57) ABSTRACT

An integrated circuit system, and a method of manufacture thereof, includes an integrated circuit package connected to a package interconnect connectible to an external resistor, wherein the integrated circuit package includes a master integrated circuit and a slave integrated circuit, the master integrated circuit is connectible to the external resistor and the slave integrated circuit, the master integrated circuit includes a master constant current and a slave constant current, the master constant current flows through the external resistor, and the slave constant current is based on the master constant current.

19 Claims, 3 Drawing Sheets

INTEGRATED CIRCUIT SYSTEM WITH EXTERNAL RESISTOR TO PROVIDE CONSTANT CURRENT BIAS AND METHOD OF MANUFACTURE THEREOF

TECHNICAL FIELD

The present invention relates generally to an integrated circuit system, and more particularly to a system for integrated circuits with external resistors.

BACKGROUND

The proliferation of configurable electronic devices continues to expand. The development of system in package (SIP) devices has advanced the development of smartphones, tablet computers, robotic applications, vending machines, and much more. The combination of functions within a SIP can be problematic as the electrical and timing requirements of the combined functions can be different.

As SIP applications are expanding, problems arise due to difficulties in initialization of these devices. A careful coordination of the initialization timing within the SIP can create extremely difficult problems to solve in the field. In some extreme cases, the flexibility of the SIP is limited by the configuration required to perform the initialization calibration.

Almost all integrated circuits (ICs) contain some analog/mixed-signal blocks. These typically require a constant current and voltage reference for biasing. While the voltage reference is usually implemented with an on-chip band gap reference (BGR), the current reference typically needs an External Precision Resistor (EPR), which has less than 1% variation. The situation becomes complicated if there are multiple chips in an SIP and each needs its own EPR. For an SIP with multiple chips, multiple EPRs are required, increasing ball count and system cost.

The configuration can be much more complicated when the control device is implemented by a field programmable gate array (FPGA), which itself has a complicated initialization process. The inclusion of an FPGA, as the control device in an electronic system, can cause the initialization process to become complicated and unwieldy.

Thus, a need still remains for an integrated circuit system with external resistors. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

DISCLOSURE OF THE INVENTION

Embodiments of the present invention provide a method of manufacture of an integrated circuit system, including connecting an integrated circuit package to a package interconnect connectible to an external resistor, wherein the integrated circuit package includes a master integrated circuit and a slave integrated circuit, the master integrated circuit is connectible to the external resistor and the slave integrated circuit, the master integrated circuit includes a master constant current and a slave constant current, the master constant current flows through the external resistor, and the slave constant current is based on the master constant current.

The embodiments of the present invention provide an integrated circuit system, including an integrated circuit package connected to a package interconnect connectible to an external resistor, wherein the integrated circuit package includes a master integrated circuit and a slave integrated circuit, the master integrated circuit is connectible to the external resistor and the slave integrated circuit, the master integrated circuit includes a master constant current and a slave constant current, the master constant current flows through the external resistor, and the slave constant current is based on the master constant current.

Certain embodiments of the present invention have other steps or elements in addition to or in place of those mentioned above. The steps or the elements will become apparent to those skilled in the art from a reading of the following detailed description when taken with reference to the accompanying drawings.

BEST MODE FOR CARRYING OUT THE INVENTION

Figure 1:
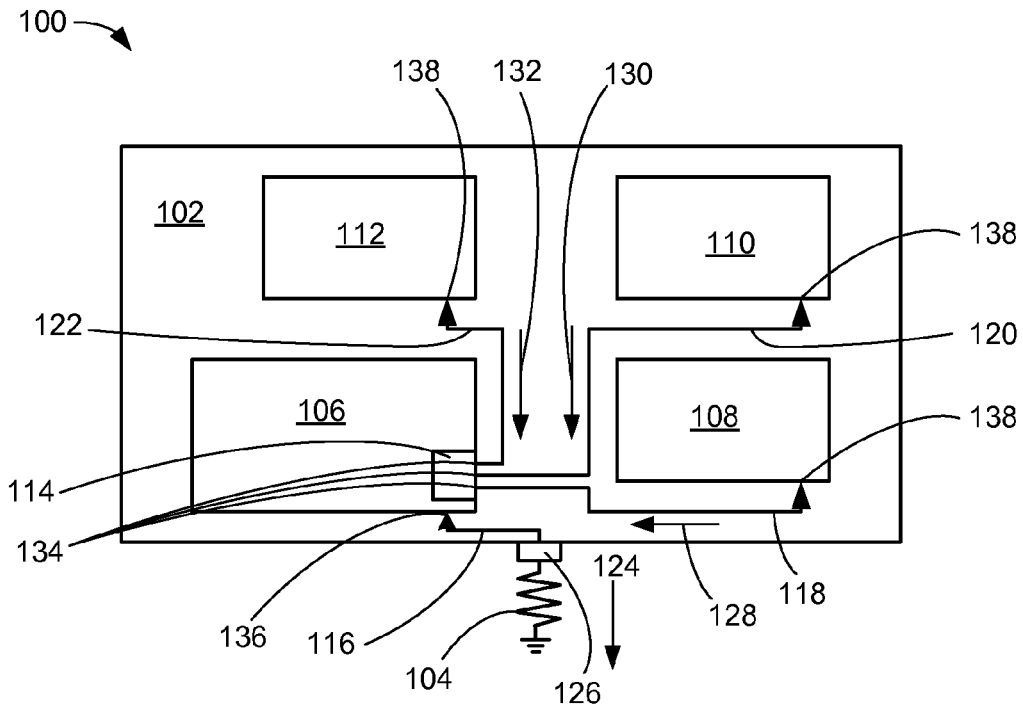
FIG. 1 is a block diagram of an integrated circuit system in a first embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the embodiments of the present invention.

In the following description, numerous specific details are given to provide a thorough understanding of the invention. However, it will be apparent that the invention can be practiced without these specific details. In order to avoid obscuring the embodiments of the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the embodiments of the present invention.

For expository purposes, the term "horizontal" as used herein is defined as a plane parallel to the plane of the active surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

Where multiple embodiments are disclosed and described having some features in common, for clarity and ease of illustration, description, and comprehension thereof, similar and like features one to another will ordinarily be described with similar reference numerals. The embodiments have been numbered second embodiment, first embodiment, etc. as a matter of descriptive convenience and are not intended to have any other significance or provide limitations for the embodiments of the present invention.

The constant current generation (CCG) can be employed for multiple chips or dies on a package. The CCG can include different methods for providing the constant currents to the chips. For example, a resistor can be externally connected to a CCG block in each chip or die.

Also for example, a resistor can be externally shared by the chips. In this case, a big mux or multiplexer with a very low leakage and on-resistance may be needed. Orchestration or arbitration may be needed to select which of the chips can connect to the resistor. A mechanism to store a constant current value may also be needed. This causes initialization problems with slow bring up.

The orchestration or the arbitration refers to a process having a master to control access to a resistor external to a packaged device. When the integrated circuits are initialized or powered up, the integrated circuits need to be alive after being completely initialized in order for one of the integrated circuits to perform as the master to control which of the integrated circuits can have access to the resistor.

However, if none of the integrated circuits is connected to the resistor, then problems can arise where the integrated circuits cannot be powered up and alive. Therefore, there is fundamentally a chicken-and-egg problem. In addition, if the integrated circuits are identical, then it can be difficult to select which of the integrated circuits can perform as the master for orchestration.

A solution to the problems can be employed using master-slave chips or dies for the constant current passing. This solution may work well if the dies are designed differently among the dies. If the dies are identical, then pre-configuration or a detection circuit may be needed to find which of the dies can be externally connected to the resistor.

Referring now to FIG. 1, therein is shown a block diagram of an integrated circuit system 100 in a first embodiment of the present invention. The integrated circuit system 100 can include an integrated circuit package 102 connected to an external resistor 104. The integrated circuit system 100 can include a number of integrated circuits. For example, the integrated circuits can include a master integrated circuit 106, a first slave integrated circuit 108, a second slave integrated circuit 110, and a third slave integrated circuit 112.

The master integrated circuit 106 can include a constant current generation circuit 114 electrically connected to the external resistor 104 by a master-resistor connector 116. The master integrated circuit 106 can be electrically connected to the first slave integrated circuit 108, the second slave integrated circuit 110, and the third slave integrated circuit 112 by a first slave interconnect 118, a second slave interconnect 120, and a third slave interconnect 122, respectively.

The integrated circuit system 100 can include an automated the constant current bias scheme for multiple chips in a 2.5D package with a limited number of external resistor balls. For example, a problem due to lack of the external resistor balls is an issue when seven or more of the external resistors are needed. Also for example, the multiple chips can include the master integrated circuit 106, the first slave integrated circuit 108, the second slave integrated circuit 110, and the third slave integrated circuit 112.

The integrated circuit system 100 can include a method of generating a master constant current 124 using the external resistor 104. For example, the external resistor 104 can include an external precision resistor within a pre-defined resistance range. It has been noted that there is no awareness of any prior art that involves sharing a common external resistor among multiple chips that are identical or otherwise.

The integrated circuit system 100 can be applied in a packaged device, such as the integrated circuit package 102, having multiple of the integrated circuits, which can include identical dies, whereby each die can include biasing of the master constant current 124 and access to the external resistor 104. However, the packaged device can have only a limited number of balls for a pre-defined number of the external resistor 104 or putting or having an external resistor ball per die is very expensive.

If all dies share the same external resistor, an external agent for orchestrating or arbitrating which of the integrated circuits get access to the external resistor 104 may be needed. In this case, a mechanism for storing a value of the master constant current 124 may also be needed. Having both the external agent and the storing mechanism causes significant bring up time and design complexity.

The disclosure of the integrated circuit system 100 includes details of an automated way of providing a constant bias current, such as the master constant current 124, to all chips including the integrated circuits described above. The automated way of providing the master constant current 124 can include as few as only one package interconnect 126 of the integrated circuit package 102 for directly connecting the constant current generation circuit 114 of the master integrated circuit 106 to the external resistor 104.

The automated way can employ only the one package interconnect 126 without the orchestration using the external agent and the storing mechanism described above. For example, the one package interconnect 126 can include any electrical connector including a ball.

The integrated circuit system 100 can include a connection for one of the integrated circuits, such as the master integrated circuit 106, to the one package interconnect 126 directly connected to the external resistor 104. The constant current generation circuit 114 of the master integrated circuit 106 can generate a number of extra constant currents including a first slave constant current 128, a second slave constant current 130, and a third slave constant current 132.

The first slave constant current 128, the second slave constant current 130, and the third slave constant current 132 can be equal to the master constant current 124 that actually flows into the external resistor 104. The first slave constant current 128, the second slave constant current 130, and the third slave constant current 132 can be sent out on or through internal ports 134 of the master integrated circuit 106.

The master-resistor connector 116 can be directly connected to a resistor port 136 of the master integrated circuit 106. For example, the internal ports 134 and the resistor port 136 can include any electrical connectors including bumps. As a specific example, the internal ports 134 and the resistor port 136 can include controlled collapse chip connection (C4) bumps.

The internal ports 134 and the resistor port 136 can be connected on the integrated circuit package 102 to slave connectors 138 of other slave integrated circuits, such as the first slave integrated circuit 108, the second slave integrated circuit 110, and the third slave integrated circuit 112. With this connection, the first slave integrated circuit 108, the second slave integrated circuit 110, and the third slave integrated circuit 112 can operate with the first slave constant current 128, the second slave constant current 130, and the third slave constant current 132, respectively.

As such, the first slave integrated circuit 108, the second slave integrated circuit 110, and the third slave integrated circuit 112 can operate as if the slave connectors 138 are connected to resistors that are external to the integrated circuit package 102. The slave integrated circuits may not distinguish between having the first slave constant current 128, the second slave constant current 130, and the third slave constant current 132, respectively, through the external resistor 104 or through the master constant current 124.

Therefore, the master integrated circuit 106 can generate the first slave constant current 128, the second slave constant current 130, and the third slave constant current 132 as copies or duplicates of the master constant current 124 based on the external resistor 104. The master integrated circuit 106 can provide constant currents to all the slave integrated circuits or the integrated circuits can be daisy chained to save C4 bumps.

For example, the slave connectors 138 can include any electrical connectors including bumps. As a specific example, the slave connectors 138 can include C4 bumps.

The integrated circuit package 102 having only the one package interconnect 126 provides an advantage of bringing up almost instantaneously all the integrated circuits as if each of the integrated circuits had its own external resistor without the need of any external orchestration or complex multiplexing logic. The advantage also provides reduction in number of package balls.

Such advantage is provided even when the integrated circuits are designed differently. For example, the master integrated circuit 106 is pre-configured as a master, and slave integrated circuits, such as the first slave integrated circuit 108, the second slave integrated circuit 110, and the third slave integrated circuit 112 are pre-configured as slaves to and thus controlled by the master.

The master integrated circuit 106 providing any number of slave constant currents provides scalability such that any number of the slave integrated circuits can be connected to the master integrated circuit 106. The scalability is provided without adding more package balls for external resistors for generation of the slave constant currents.

The master integrated circuit 106 providing the first slave constant current 128, the second slave constant current 130, and the third slave constant current 132 provides an advantage in terms of reliability. The advantage provides no error accumulation compared to cascade or daisy chain of chips.

It has been discovered that the integrated circuit package 102 having only the one package interconnect 126 for connecting only the master integrated circuit 106 to the external resistor 104 provides improved performance. The performance is improved because the one package interconnect 126 provides a technique for bringing up almost instantaneously within a pre-defined amount of time of all the integrated circuits, such as the master integrated circuit 106, the first slave integrated circuit 108, the second slave integrated circuit 110, and the third slave integrated circuit 112.

It has also been discovered that the master integrated circuit 106, the first slave integrated circuit 108, the second slave integrated circuit 110, and the third slave integrated circuit 112 are automatically initialized or powered up without the orchestration or the arbitration by the external agent, thereby improving the performance.

Figure 2:
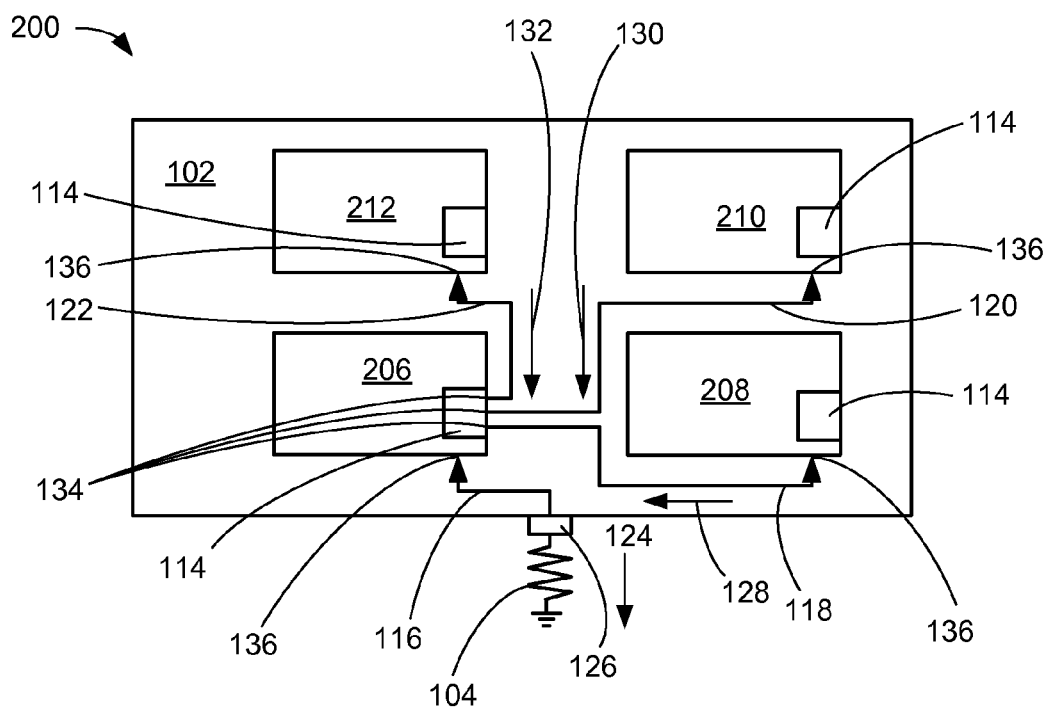
FIG. 2 is a block diagram of an integrated circuit system in a second embodiment of the present invention.

Referring now to FIG. 2, therein is shown a block diagram of an integrated circuit system 200 in a second embodiment of the present invention. The integrated circuit system 200 can include the integrated circuit package 102 connected to the external resistor 104. The integrated circuit system 200 can include a number of identical integrated circuits. For example, the identical integrated circuits can include a master integrated circuit 206, a first slave integrated circuit 208, a second slave integrated circuit 210, and a third slave integrated circuit 212.

Each of the master integrated circuit 206, the first slave integrated circuit 208, the second slave integrated circuit 210, and the third slave integrated circuit 212 can include the constant current generation circuit 114. The constant current generation circuit 114 of the master integrated circuit 206 can be electrically connected to the external resistor 104 by the master-resistor connector 116. The master integrated circuit 206 can be electrically connected to the first slave integrated circuit 208, the second slave integrated circuit 210, and the third slave integrated circuit 212 by the first slave interconnect 118, the second slave interconnect 120, and the third slave interconnect 122, respectively.

The integrated circuit system 200 can include a current replica method of passing the master constant current 124 from the master integrated circuit 206 to each of the first slave integrated circuit 208, the second slave integrated circuit 210, and the third slave integrated circuit 212. In this case, only one of the integrated circuits, such as the master integrated circuit 206, can function as a master to other integrated circuits. The first slave constant current 128, the second slave constant current 130, and the third slave constant current 132 can be generated as multiple copies of the master constant current 124 of the external resistor 104.

The first slave constant current 128, the second slave constant current 130, and the third slave constant current 132 can flow through the resistor port 136 of each of the first slave integrated circuit 208, the second slave integrated circuit 210, and the third slave integrated circuit 212, respectively. The first slave integrated circuit 208, the second slave integrated circuit 210, and the third slave integrated circuit 212 may not distinguish where the first slave constant current 128, the second slave constant current 130, and the third slave constant current 132 come from. The first slave integrated circuit 208, the second slave integrated circuit 210, and the third slave integrated circuit 212 can subsequently generate copies of the first slave constant current 128, the second slave constant current 130, and the third slave constant current 132.

Designs of the master integrated circuit 206, the first slave integrated circuit 208, the second slave integrated circuit 210, and the third slave integrated circuit 212 can be identical. When the designs are identical, the internal ports 134 of the first slave integrated circuit 208, the second slave integrated circuit 210, and the third slave integrated circuit 212 can be unconnected on the integrated circuit package 102.

The constant current generation circuit 114 of each of the first slave integrated circuit 208, the second slave integrated circuit 210, and the third slave integrated circuit 212 can subsequently be powered down after an initial power-up cycle completes. The initial power-up cycle refers to a process of powering up or initialization of the master integrated circuit 206, the first slave integrated circuit 208, the second slave integrated circuit 210, and the third slave integrated circuit 212. When the initial power-up cycle completes, the master integrated circuit 206, the first slave integrated circuit 208, the second slave integrated circuit 210, and the third slave integrated circuit 212 are alive.

The master integrated circuit 206 providing the first slave constant current 128, the second slave constant current 130, and the third slave constant current 132 provides an advantage in terms of reliability. The advantage provides no error accumulation compared to cascade or daisy chain of chips.

It has been discovered that the integrated circuit package 102 having only the one package interconnect 126 for connecting only the master integrated circuit 206 to the external resistor 104 provides improved performance. The performance is improved because the one package interconnect 126 provides a technique for bringing up almost instantaneously within a pre-defined amount of time of all the integrated circuits, such as the master integrated circuit 206, the first slave integrated circuit 208, the second slave integrated circuit 210, and the third slave integrated circuit 212. Such advantage is provided with identical designs among the master integrated circuit 206, the first slave integrated circuit 208, the second slave integrated circuit 210, and the third slave integrated circuit 212.

It has also been discovered that the master integrated circuit 206, the first slave integrated circuit 208, the second slave integrated circuit 210, and the third slave integrated circuit 212 are automatically initialized or powered up without the orchestration or the arbitration by the external agent, thereby improving the performance.

Figure 3:
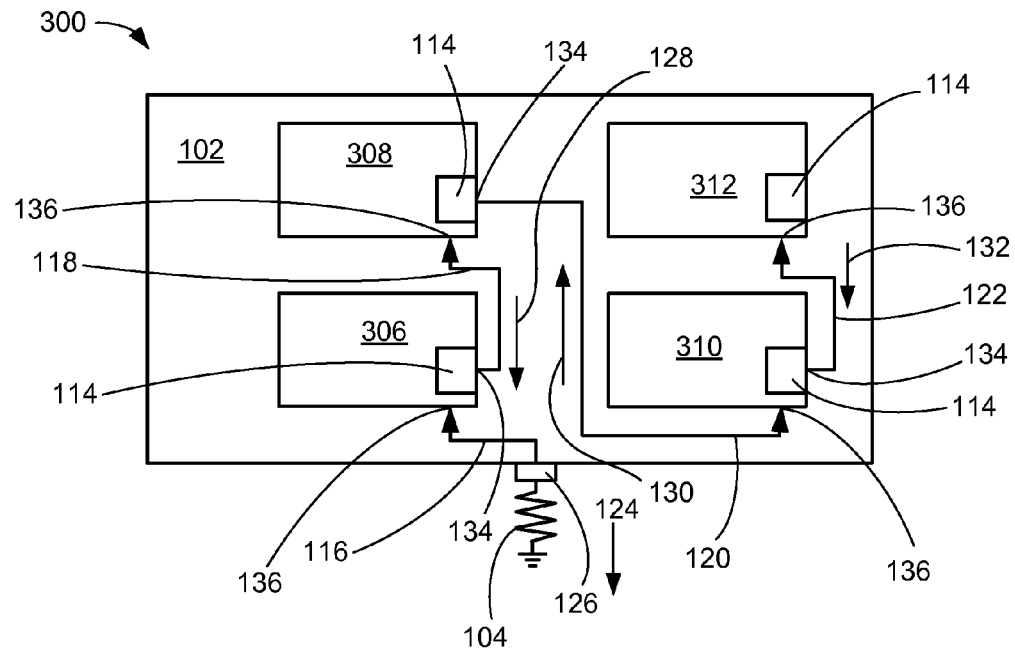
FIG. 3 is a block diagram of an integrated circuit system in a third embodiment of the present invention.

Referring now to FIG. 3, therein is shown a block diagram of an integrated circuit system 300 in a third embodiment of the present invention. The integrated circuit system 300 can include the integrated circuit package 102 connected to the external resistor 104.

The integrated circuit system 300 can include a number of identical integrated circuits. For example, the identical integrated circuits can include a master integrated circuit 306, a first slave integrated circuit 308, a second slave integrated circuit 310, and a third slave integrated circuit 312.

Each of the master integrated circuit 306, the first slave integrated circuit 308, the second slave integrated circuit 310, and the third slave integrated circuit 312 can include the constant current generation circuit 114. The constant current generation circuit 114 of the master integrated circuit 306 can be electrically connected to the external resistor 104 by the master-resistor connector 116.

The master integrated circuit 306 can be electrically connected to the first slave integrated circuit 308 by the first slave interconnect 118. The first slave integrated circuit 308 can be electrically connected to the second slave integrated circuit 310 by the second slave interconnect 120. The second slave integrated circuit 310 can be electrically connected to the third slave integrated circuit 312 by the third slave interconnect 122.

The integrated circuit system 300 can include a current replica method of passing the master constant current 124 from the master integrated circuit 306 to the slave integrated circuits serially connected in a daisy chain. In this case, only one of the integrated circuits, such as the master integrated circuit 306, can function as a master to other integrated circuits.

The first slave constant current 128 can be generated as the only copy of the master constant current 124 of the external resistor 104. The first slave constant current 128 can flow through and from the resistor port 136 of the next slave integrated circuit, such as the first slave integrated circuit 308. The first slave constant current 128 can also flow through one of the internal ports 134 of the master integrated circuit 306.

The first slave integrated circuit 308 may not distinguish where the first slave constant current 128 comes from. The first slave integrated circuit 308 can subsequently generate a copy of the first slave constant current 128.

The second slave constant current 130 can be generated as a copy of the first slave constant current 128. The second slave constant current 130 can flow through and from the resistor port 136 of the next slave integrated circuit, such as the second slave integrated circuit 310. The second slave constant current 130 can also flow through one of the internal ports 134 of the first slave integrated circuit 308.

The second slave integrated circuit 310 may not distinguish where the second slave constant current 130 comes from. The second slave integrated circuit 310 can subsequently generate a copy of the second slave constant current 130.

The third slave constant current 132 can be generated as a copy of the second slave constant current 130. The third slave constant current 132 can flow through and from the resistor port 136 of the next slave integrated circuit, such as the third slave integrated circuit 312. The third slave constant current 132 can also flow through one of the internal ports 134 of the second slave integrated circuit 310. The third slave integrated circuit 312 may not distinguish where the third slave constant current 132 comes from.

A copy of the master constant current 124 can be passed from one of the slave integrated circuits to another of the slave integrated circuits through package routing, such as the first slave interconnect 118, the second slave interconnect 120, and the third slave interconnect 122. This process continues until all of the slave integrated circuits are connected.

In FIG. 3, a number of the internal ports 134 on the master integrated circuit 306, the first slave integrated circuit 308, the second slave integrated circuit 310, and the third slave integrated circuit 312 can be reduced. For example, the number can be reduced from 3 down to just 1, compared to a number of the internal ports 134 in FIGS. 1-2. This provides reduction of the number of the internal ports 134 and thus potentially reduced routing areas since the integrated circuits can be placed immediately next to each other and traces between the integrated circuits can be reduced as well.

It has been discovered that the master integrated circuit 306, the first slave integrated circuit 308, the second slave integrated circuit 310, and the third slave integrated circuit 312 serially connected in the daisy chain improves routability of the traces between the integrated circuits. The routability is improved because the integrated circuits are placed immediately next to each other and thus resulting in reduced wire lengths of the first slave interconnect 118, the second slave interconnect 120, and the third slave interconnect 122.

Figure 4:
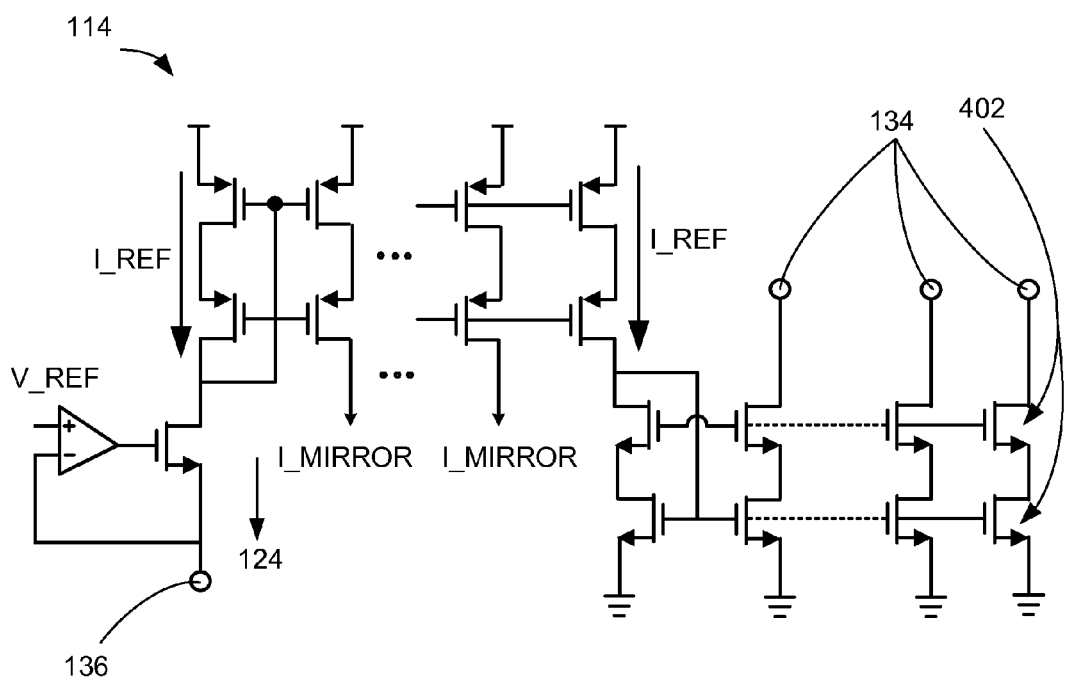
FIG. 4 is an example of a circuit diagram of the constant current generation circuit.

Referring now to FIG. 4, therein is shown an example of a circuit diagram of the constant current generation circuit 114. The constant current generation circuit 114 can generate current mirror circuits for generating the copies of the master constant current 124 through the resistor port 136.

The master constant current 124, which can be approximately equal to a reference current labeled as I_REF, can be replicated and subsequently passed from a master integrated circuit, such as the master integrated circuit 106 of FIG. 1, the master integrated circuit 206 of FIG. 2, or the master integrated circuit 306 of FIG. 3. A copy of the master constant current 124 can be passed on to the slave integrated circuits.

As such, the first slave constant current 128 of FIG. 1, the second slave constant current 130 of FIG. 1, and the third slave constant current 132 of FIG. 1 through the internal ports 134 can be approximately the same as the master constant current 124. The internal ports 134 can be at source or drain terminals of transistors 402.

For example, the transistors 402 can include metal-oxide-semiconductor field-effect (MOSFET) transistors. Also for example, FIG. 4 shows the transistors 402 as pMOS transistors connected in series and to the internal ports 134. As a specific example, the internal ports 134 can be at the drain terminals of one of the transistors 402, of which the source terminals can be serially connected to the drain terminals of another of the transistors 402.

Two of the transistors 402 that are connected in series can functionally provide an internal resistor with the slave constant currents through the internal ports 134 and the internal resistor. Thus, external resistors for the first slave integrated circuit 108 of FIG. 1, the second slave integrated circuit 110 of FIG. 1, and the third slave integrated circuit 112 of FIG. 1 may not be needed because of the availability of the transistors 402 connected to the internal ports 134.

It has been discovered that the constant current generation circuit 114 having the transistors 402 serially connected with each other and directly connected to the internal ports 134 improves reliability. The reliability is improved because the transistors 402 provide a path for the first slave constant current 128, the second slave constant current 130, and the third slave constant current 132 to be generated. The first slave constant current 128, the second slave constant current 130, and the third slave constant current 132 are generated as multiple copies of the master constant current 124, thereby are used to reliably bringing up the slave integrated circuits without the need for the external resistors for the slave integrated circuits.

Figure 5:
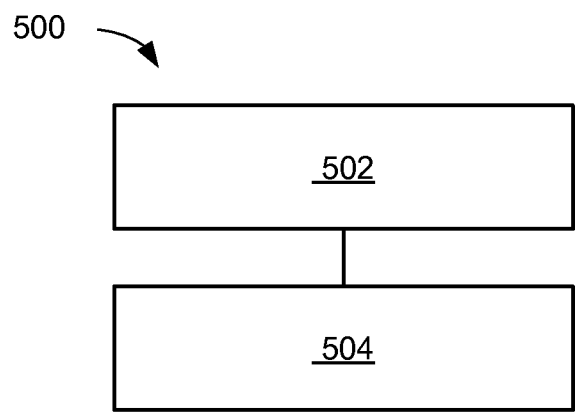
FIG. 5 is a flow chart of a method of manufacture of an integrated circuit system in a further embodiment of the present invention.

Referring now to FIG. 5, therein is shown a flow chart of a method 500 of manufacture of an integrated circuit system in a further embodiment of the present invention. The method 500 includes: providing an external resistor in a block 502; and connecting an integrated circuit package to the external resistor, wherein the integrated circuit package includes a master integrated circuit and a slave integrated circuit, the master integrated circuit is connected to the external resistor and the slave integrated circuit, the master integrated circuit includes a master constant current and a slave constant current, the master constant current flows through the external resistor, and the slave constant current is based on the master constant current in a block 504.

Thus, it has been discovered that the integrated circuit system and devices or products of the embodiments of the present invention furnish important and heretofore unknown and unavailable solutions, capabilities, and functional aspects for integrating configurable FPGA based stacked integrated circuit systems.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing the integrated circuit system fully compatible with conventional manufacturing methods or processes and technologies.

Another important aspect of the embodiments of the present invention is that it valuably supports and services the historical trend of reducing costs, simplifying systems, and increasing performance.

These and other valuable aspects of the embodiments of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
    connecting a package interconnect of an integrated circuit package to an external resistor that is external to the integrated circuit package, wherein the integrated circuit package includes a master integrated circuit die, a first slave integrated circuit die, and a second slave integrated circuit die, and wherein no resistors external to the integrated circuit package are directly connected to the first and second slave integrated circuit dies;
    electrically connecting the master integrated circuit die in the integrated circuit package to the external resistor through the package interconnect; and
    electrically connecting the master integrated circuit die to the first slave integrated circuit die and to the second slave integrated circuit die, wherein the master integrated circuit includes a master constant current and a slave constant current, the master constant current flows through the package interconnect, and the slave constant current is generated by the master integrated circuit die based on the master constant current.

2. The method as claimed in claim 1 wherein the first slave integrated circuit die is different from the master integrated circuit die and the second slave integrated circuit die is different from the first slave integrated circuit die.

3. The method as claimed in claim 1 wherein the first slave integrated circuit die receives the slave constant current from the master integrated circuit die over a first slave interconnect, the first slave integrated circuit die generates a second slave constant current based on the first slave constant current, and the second slave integrated circuit die receives the second slave constant current from the first slave integrated circuit die over a second slave interconnect that is different from the first slave interconnect.

4. The method as claimed in claim 1 wherein the first slave integrated circuit die receives the slave constant current from the master integrated circuit die over a first slave interconnect and the second slave integrated circuit die receives the slave constant current from the master integrated circuit die over a second slave interconnect that is different from the first slave interconnect.

5. An integrated circuit system comprising:
    an external resistor; and
    an integrated circuit package having a package interconnect that is connected to the external resistor, wherein the external resistor is external to the integrated circuit package, and the integrated circuit package comprises:

a master integrated circuit die,
a first slave integrated circuit die that is separate from the master integrated circuit die, and
a second slave integrated circuit die that is separate from the master integrated circuit die and the first slave integrated circuit die, wherein the master integrated circuit die is electrically connected to the external resistor through the package interconnect, the master integrated circuit die is operable to generate a slave constant current based on a master constant current that flows through the package interconnect, the first and second slave integrated circuit dies receive the slave constant current from the master integrated circuit die, and no resistors external to the integrated circuit package are directly connected to the first and second slave integrated circuit dies.

6. The system as claimed in claim 5 wherein the master integrated circuit die comprises a constant current generation circuit that generates the slave constant current and that is electrically connected to the first slave integrated circuit die and to the second slave integrated circuit die.

7. The system as claimed in claim 5 wherein the master integrated circuit die, the first slave integrated circuit die, and the second slave integrated circuit die are identical.

8. The system as claimed in claim 5 wherein the slave constant current generated by the master integrated circuit die is equal to the master constant current.

9. The system as claimed in claim 5 wherein the master integrated circuit die, the first slave integrated circuit die, and the second slave integrated circuit die each include different respective circuitry.

10. The system as claimed in claim 5 wherein the master integrated circuit die comprises a constant current generation circuit, the constant current generation circuit includes an internal port and a transistor serially connected to the internal port.

11. The system defined in claim 10, further comprising a second transistor coupled in series with the transistor and the internal port, wherein a gate terminal of the transistor is coupled to a gate terminal of a third transistor, a gate terminal of the second transistor is coupled to a gate terminal of a fourth transistor and to a circuit node between the third transistor and a fifth transistor, and the internal port is coupled to the first slave integrated circuit die.

12. The integrated circuit system as claimed in claim 5, wherein the master integrated circuit die is electrically connected to the first slave integrated circuit die through a first slave interconnect and is electrically connected to the second slave integrated circuit die through a second slave interconnect that is different from the first slave interconnect, wherein the first slave integrated circuit die receives the slave constant current from the master integrated circuit die over the first slave interconnect, and wherein the second slave integrated circuit die receives the slave constant current from the master integrated circuit die over the second slave interconnect.

13. The integrated circuit system as claimed in claim 12, wherein the first slave interconnect and the second slave interconnect each comprise a controlled collapse chip connection (C4) bump.

14. The integrated circuit system as claimed in claim 12, wherein the first slave interconnect and the second slave interconnect each comprise a conductive package ball.

15. An integrated circuit system comprising:
an external resistor; and
an integrated circuit package having a package interconnect that is connected to the external resistor, wherein the external resistor is external to the integrated circuit package, and the integrated circuit package comprises:
a master integrated circuit die,
a first slave integrated circuit die, and
a second slave integrated circuit die, wherein the master integrated circuit die is electrically connected to the external resistor through the package interconnect, the master integrated circuit die is operable to generate a first slave constant current based on a master constant current that flows through the package interconnect, the first slave integrated circuit die receives the slave constant current from the master integrated circuit die, the first slave integrated circuit die generates a second slave constant current based on the first slave constant current, the second slave integrated circuit die receives the second slave constant current from the first slave integrated circuit die, and no resistors external to the integrated circuit package are directly connected to the first and second slave integrated circuit dies.

16. The integrated circuit defined in claim 15, wherein the first slave integrated circuit die receives the first slave constant current from the master integrated circuit die over a first slave interconnect and the second slave integrated circuit die receives the second slave constant current from the first slave integrated circuit die over a second slave interconnect that is different from the first slave interconnect.

17. The integrated circuit defined in claim 16, wherein the first slave constant current is equal to the second slave constant current.

18. The integrated circuit defined in claim 16, wherein the second slave constant current is equal to the master constant current.

19. The integrated circuit defined in claim 18, wherein the second slave constant current is equal to the first slave constant current.

* * * * *